United States Patent [19]
Beers

[11] Patent Number: 5,829,942
[45] Date of Patent: Nov. 3, 1998

[54] APPARATUS FOR LOADING AND UNLOADING CIRCUIT BOARDS ALONG A CONVEYOR SYSTEM

[75] Inventor: Greg C. Beers, Birmingham, Ala.

[73] Assignee: Automation Technologies Industries, Birmingham, Ala.

[21] Appl. No.: 797,166

[22] Filed: Feb. 10, 1997

[51] Int. Cl.⁶ .................................................. B65G 1/00
[52] U.S. Cl. .......................................... 414/331; 414/280
[58] Field of Search .................................... 414/280, 331, 414/661, 751, 609, 416, 277, 278

[56] References Cited

U.S. PATENT DOCUMENTS

| | | | |
|---|---|---|---|
| 4,558,983 | 12/1985 | Freeman et al. | 414/331 |
| 4,712,963 | 12/1987 | Kondo | 414/331 X |
| 4,725,182 | 2/1988 | Sakamato et al. | 414/331 |
| 4,900,212 | 2/1990 | Mikahara | 414/331 X |
| 4,932,828 | 6/1990 | Katae et al. | 414/331 X |
| 5,032,053 | 7/1991 | Krieg | 414/280 X |
| 5,139,384 | 8/1992 | Tuttobene | 414/280 X |
| 5,203,661 | 4/1993 | Tanita et al. | 414/280 X |
| 5,358,375 | 10/1994 | Kawada et al. | 414/331 X |
| 5,605,428 | 2/1997 | Birkner et al. | 414/331 |
| 5,607,275 | 3/1997 | Woodruff et al. | 414/331 |
| 5,628,605 | 5/1997 | Miyoshi | 414/331 |

OTHER PUBLICATIONS

"Magazine Buffer Storage," Dynaspace.
"5423A SM Magazine Elevator " Universal Instruments Corporations, 1994.
"Model 8130 Magazine Loader and Unloader," Simplimatic Engineering Company, 1992.
"Magazine Elevators for PCBS".

*Primary Examiner*—David A. Bucci
*Attorney, Agent, or Firm*—Veal & Associates

[57] ABSTRACT

A dedicated elevator having a "smart" handler mounted thereon to move circuit boards and the like from an assembly line to a storage magazine and back, providing a greatly reduced footprint over apparatus which must move and elevate entire magazines and which must accommodate magazines of various sizes. The smart handler both inserts boards into the magazine and retrieves the boards from the magazine. The smart handler includes a photosensitive gripper/pusher which can detect the edge of a board and grip the board by the detected edge to retrieve it from a slot in a storage assembly. The handler includes an actuator for moving the gripper along the direction of movement of the board for a predetermined distance to detect and engage boards which are irregularly stacked in a storage apparatus. The handler further includes a edge type conveyor which delivers boards to the gripper for full insertion into the storage assembly and receives boards from the gripper for delivery to the assembly line. A plurality of sensors and control elements monitor the position of the board and the components to accurately position the cooperative elements.

11 Claims, 8 Drawing Sheets

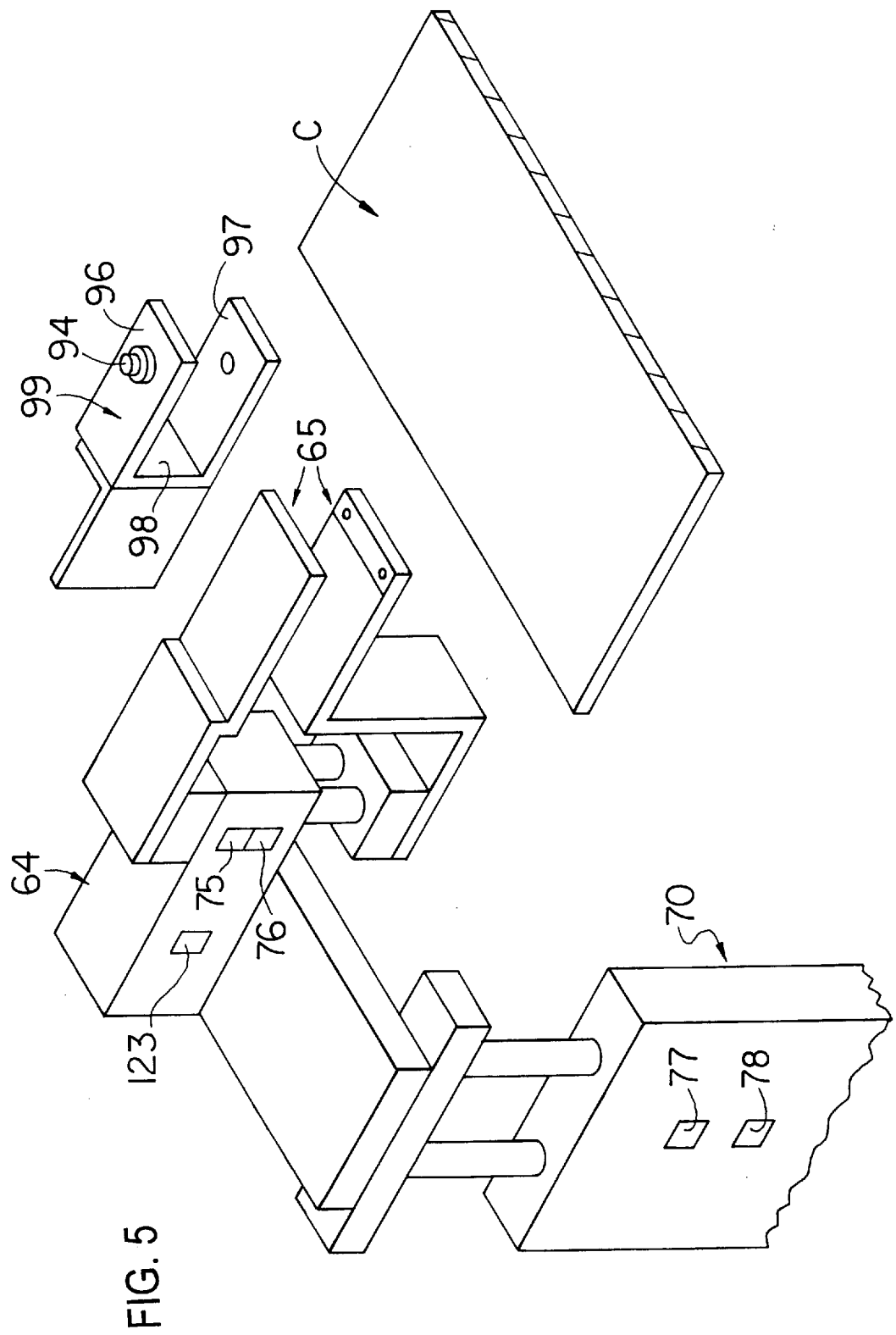

APPARATUS FOR LOADING AND UNLOADING CIRCUIT BOARDS ALONG A CONVEYOR SYSTEM

FIELD OF THE INVENTION

The present invention relates to the field of automatic handling apparatus and more particularly to apparatus dedicated to the handling of printed circuit boards. In even greater particularity the present invention relates to apparatus for loading and unloading a plurality of circuit boards in a magazine for storage or transport during the manufacturing process. In even greater particularity it may be understood that the present invention is an apparatus for placing and retrieving circuit boards into a stacked vertical array.

BACKGROUND OF THE INVENTION

Printed circuit board manufacturing processes typically require many stages of production, from the formation of the "board" to the etching of the wiring pattern on the board to the insertion of the various electronic and electrical components on the board. In some stages of production, the individual boards are processed more rapidly than in others. Additionally, shift changes and supply and demand considerations sometimes make it necessary to store circuit boards.

Typically, the production facility will include numerous conveyors which move the boards from one area to another for processing, attachment of components, and the like. Frequently, circuit boards are transported between conveyors by placing them in vertical magazines and transporting the magazine and contents to the appropriate location. Magazine loaders and unloaders are well known in the industry. The devices typically include an elevator for raising and lowering the magazine relative to the conveyor which delivers the boards or receives the boards in the magazine. In the norm, the magazines are delivered on conveyors themselves such that a rather large "footprint" or floor space is occupied by the apparatus. Typically the foot print is further enlarged by a secondary input and/or output conveyor. In all known examples of magazine loaders and unloaders, the circuit boards are pushed into and out of registry in the magazine, thus proper alignment of the magazine and implement used to push the board is necessary to prevent jamming.

A further discussion of the background is presented in U.S. Pat. No. 4,725,182, issued in 1988. The device disclosed therein represents an improvement over the devices which move the magazine vertically for loading and unloading, however, the device has failed to gain acceptance and is believed to be deficient in its ability to reliably place and retrieve boards from a magazine.

SUMMARY OF THE INVENTION

It is the principal object of the present invention to provide a small footprint apparatus for loading and unloading magazines in a printed circuit board assembly line.

It is another object of the invention to provide capacity to load or unload up to four magazines at a time in a footprint of less than 18 inches in length which is very important in factories that do not have abundant space for manufacturing lines.

It is another object of the invention to simplify and economize the magazine loading operation.

It is another object of the invention to provide both a magazine loader and a magazine unloader in the same device.

It is yet another object of the invention to provide a magazine loader and unloader that is not line dependent, but rather can be moved from one line to another within a facility to meet the changing needs of the user.

These and other objects and advantages of the present invention are accomplished through the unique combination of sensory and control technology which allow the apparatus to repetitively and accurately retrieve and position circuit boards between the magazine and the assembly line. Specifically, my apparatus comprises a dedicated elevator having a "smart" handler mounted thereon to move the boards from the assembly line to the magazine and back. In as much as the dedicated elevator need only be the size necessary to handle the expected board size, the foot print is greatly reduced over apparatus which must move and elevate entire magazines. The smart handler both inserts boards into the magazine and retrieves the boards from the magazine.

The smart handler includes a photosensitive gripper/pusher which can detect the edge of a board and grip the board by the detected edge to retrieve it from a slot in a storage assembly. The handler includes means for moving the gripper along the direction of movement of the board for a predetermined distance to detect and engage boards which are irregularly stacked in the magazine apparatus. The handler further includes a edge type conveyor which delivers boards to the gripper for full insertion into the storage assembly and receives boards from the gripper for delivery to the assembly line. A plurality of sensors and control elements monitor the position of the board and the components to accurately position the cooperative elements.

BRIEF DESCRIPTION OF THE DRAWINGS

Apparatus embodying features of my invention are depicted in the accompanying drawings which form a portion of this disclosure and wherein:

FIG. 5 is an enlarged perspective view of the gripper/pusher;

DESCRIPTION OF THE PREFERRED EMBODIMENT

It is to be understood that the apparatus claimed is a component to be used in an assembly process to facilitate the storage of circuit boards C or boards as they may be referred to, and the like in a magazine or in a buffer. The boards C may be stored at any convenient stage of completion with or without electrical or electronic components inserted on the board. The boards may be stored simply for time management purposes or for transportation from one area to another. Consequently, the apparatus used in conjunction with the remainder of the assembly of the printed circuit board are not a part of this invention and no specific description will be attempted. The present invention interfaces with the other assembly apparatus at the end of an infeed or outfeed conveyor.

Figure 1:
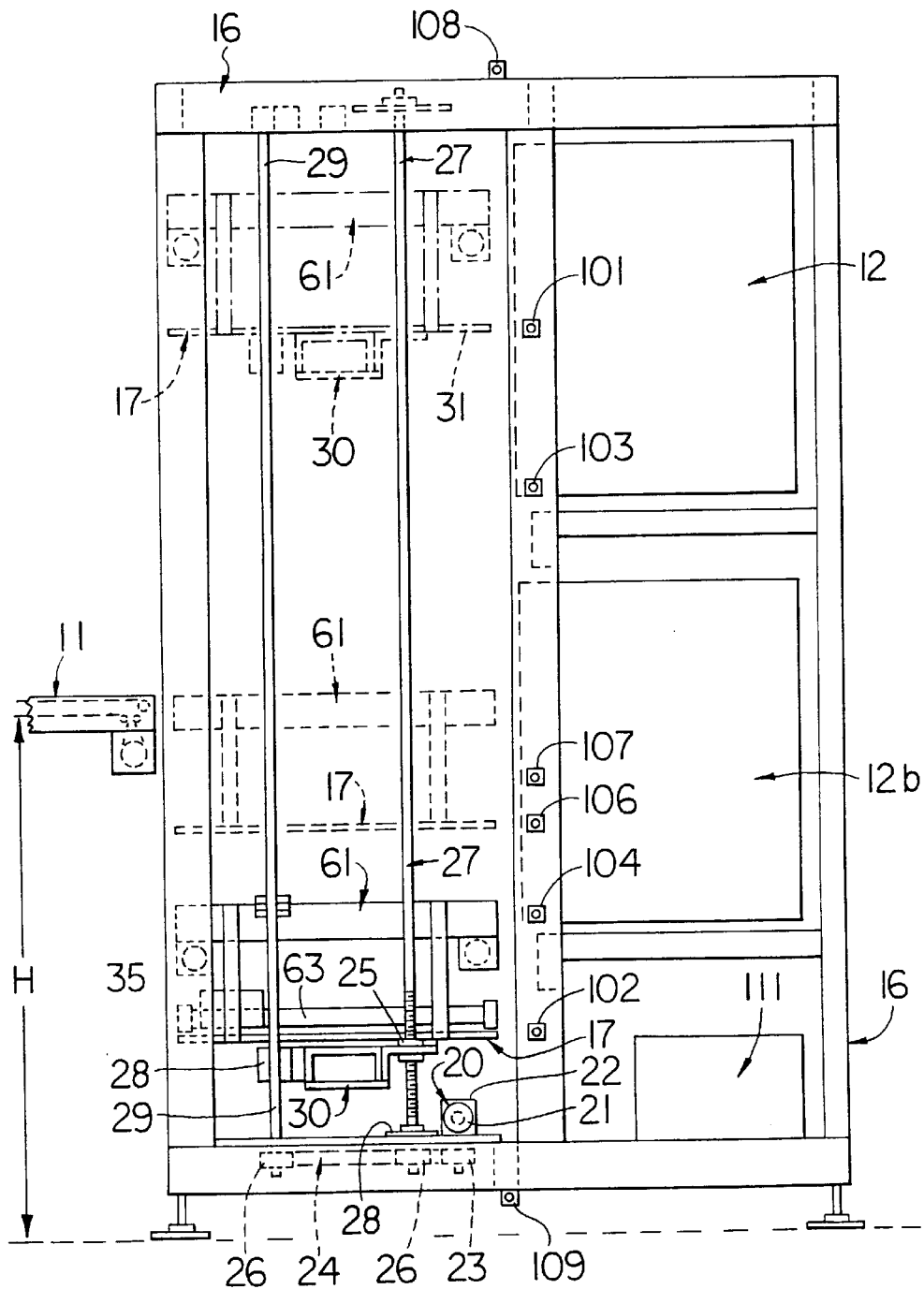
FIG. 1 is a side elevational view of the elevator and handler mounted within a frame and servicing an upper and lower magazine.
Figure 2:
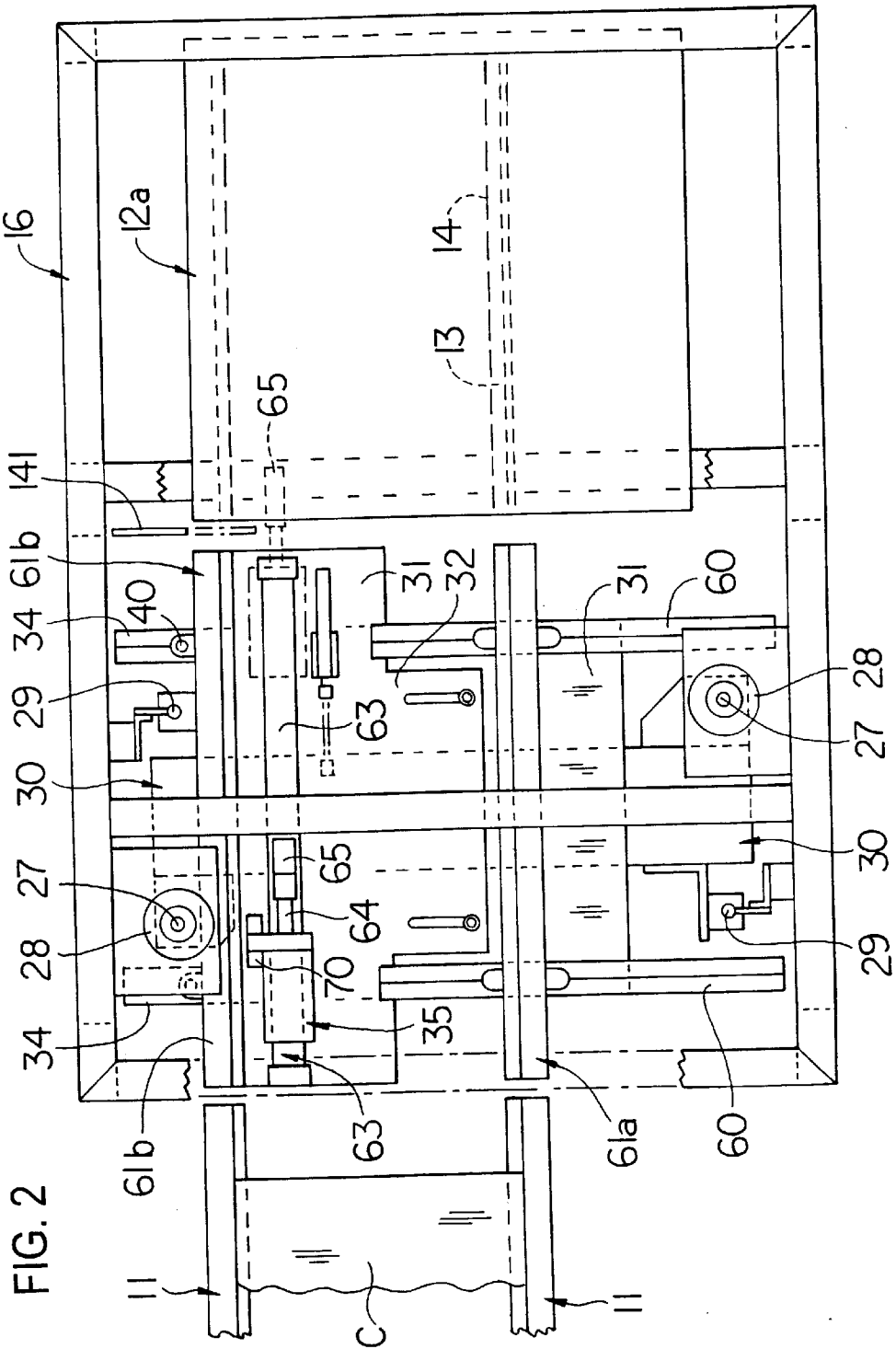
FIG. 2 is a plan view of the elevator and handler.
Figure 3:
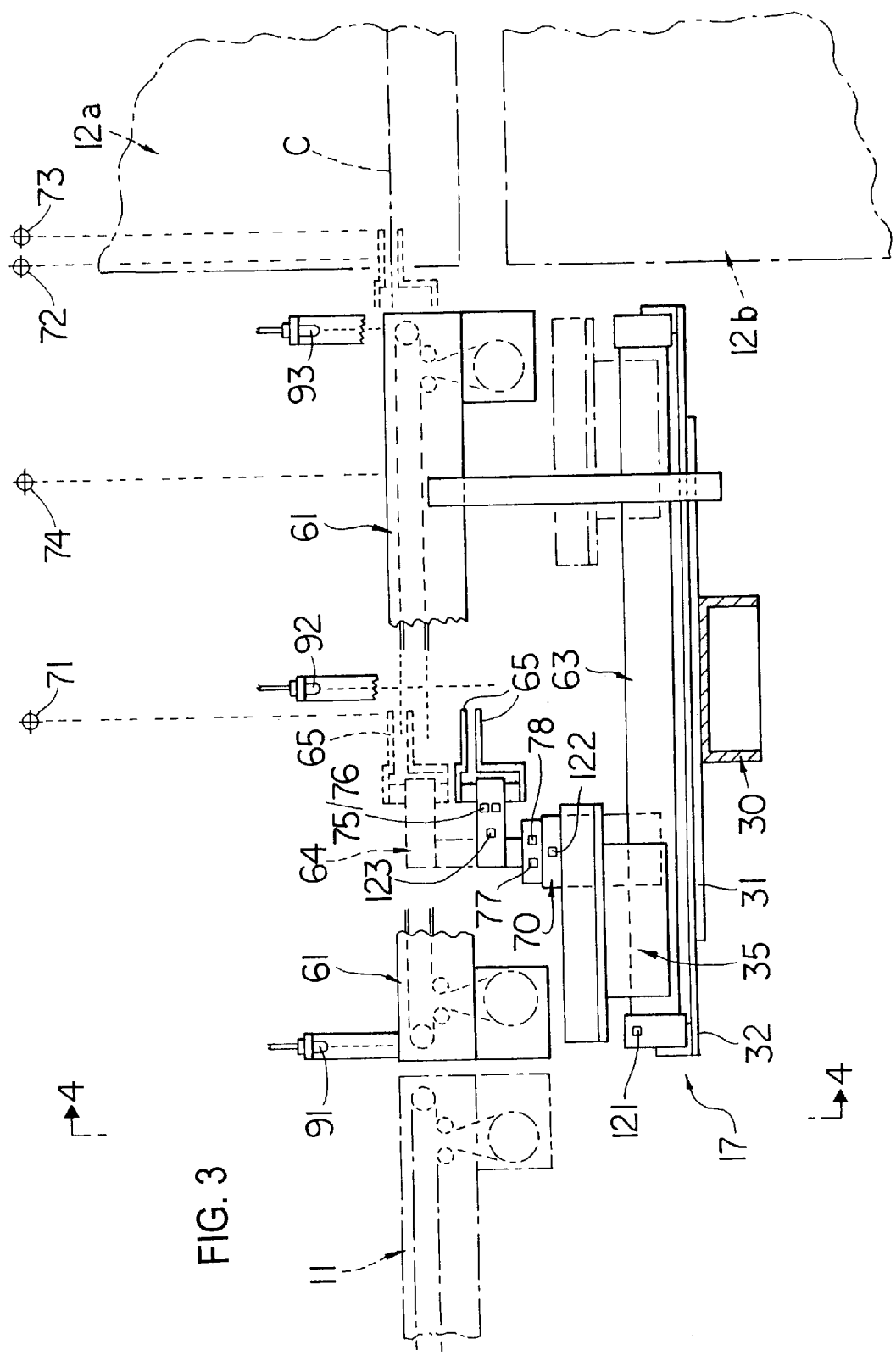
FIG. 3 is an enlarged side elevational view of the elevator and handler, in conjunction with the sensors associated with the position of the board and gripper/pusher.
Figure 4:
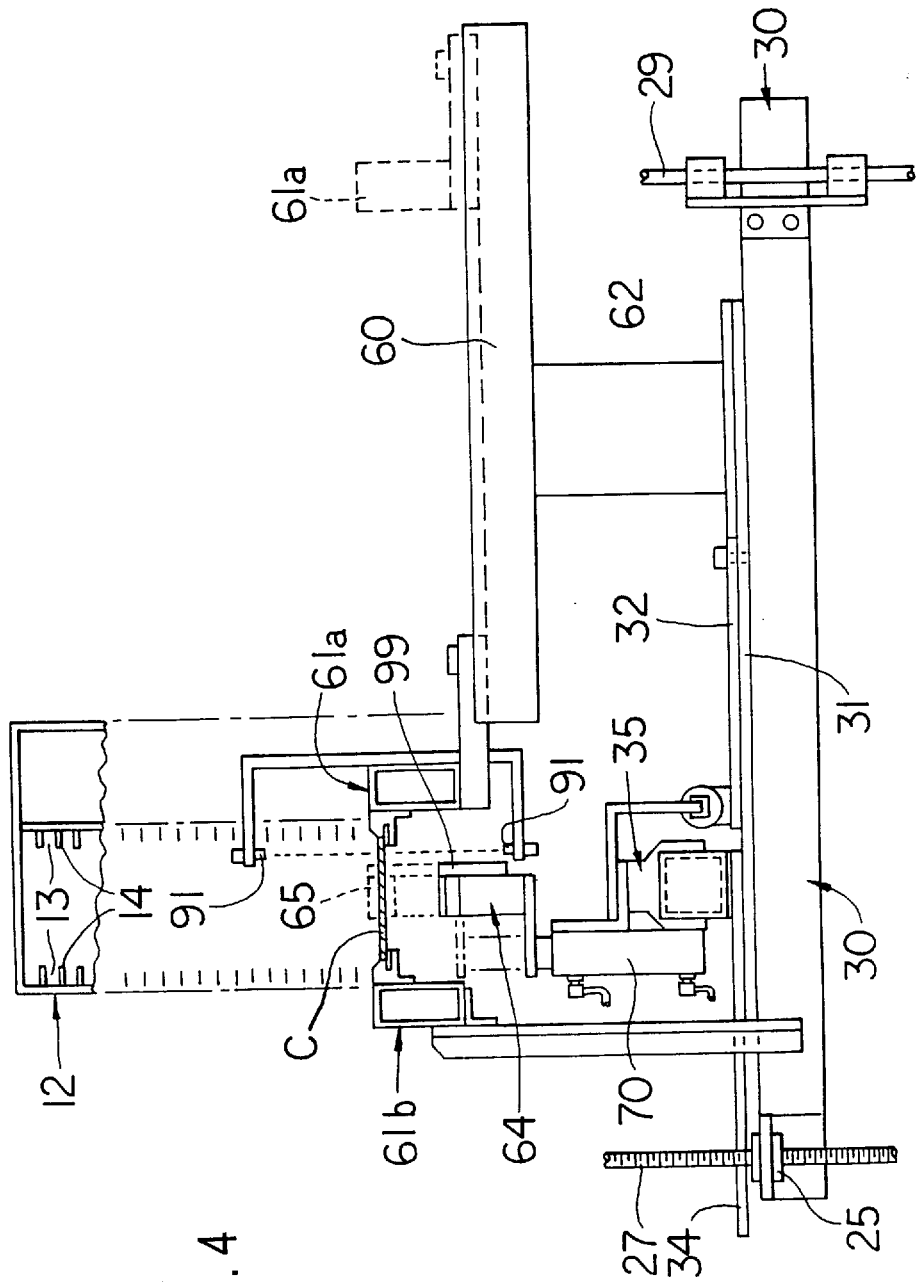
FIG. 4 is an end elevational view of the elevator and handler taken along line 4—4 of FIG. 3.

Referring to the drawings for a clearer understanding of the invention, it may be seen in FIG. 1 that a line conveyor 11 is disposed at a predetermined height H, typically an industry standard height. The conveyor 11 will be considered as an infeed or outfeed conveyor for the delivery or removal of boards from the apparatus to be described. It will be appreciated that the apparatus is expected to be able to handle boards C varying in width from three inches to eighteen inches and in length from three inches to eighteen inches. Also associated with the apparatus is at least one magazine 12. It is contemplated that up to four magazines may be serviced by the apparatus with a pair located above height H and a pair below height H with the pairs being vertically aligned. In the Fig.'s depicting more than one magazine, the magazines are designated as 12a, 12b, 12c, 12d. Each magazine 12 is intended to have up to fifty usable board slots 13, spaced ten mm apart, defined by opposed internal flanges 14 which are used to support circuit boards C in the conventional manner. It is intended that the boards be delivered or removed at least as often as every fifteen seconds, thus the apparatus must have a cycle time of less than fifteen seconds.

Again referring to FIG. 1, it will be seen that an upright frame 16 is provided for the support of a platform 17. It will be appreciated that frame 16 will support suitable enclosing panels which will minimize the opportunity for interference with the internal workings of the apparatus. Frame 16 is generally rectangular and extends upwardly from the surface on which conveyor 11 is mounted to a height sufficient to service a magazine 12 or buffer mounted at an 15 operable height above conveyor 11. Mounted within frame 16 on appropriate frame members is a lift motor 20, which is a servo motor with brake and encoder built in. Such motors are built by manufacturers such as Yaskawa and their operation including braking and encoding are understood in the art. A high speed servo motor is required for the lift to enable the apparatus to operate at less than 15 second cycle time. A servo motor controller 21, also available from Yaskawa, is conventionally associated with motor 20 as is an output gearbox 22 which is connected to a toothed drive pulley 23 about which a drive belt 24 is entrained. Drive belt 24 is a gear belt and is entrained about two toothed screw pulleys 26, each of which is affixed to an associated drive screw 27 extending vertically within and supported in appropriate bearings 28 by frame 16. As will be appreciated, the rotation of the drive screws 27 is concomitant and can be precisely controlled using servo motors 20.

A pair of lift nuts 25 are threadedly engaged on screws 27 at a common height and are affixed to a carriage assembly 30, which supports platform 17, such that rotation of the screws 27 results in vertical displacement of the assembly 30. A pair of guide rods 29 are vertically disposed in frame 16 are also engaged by carriage assembly 30 such the carriage is constrained to remain horizontally level during vertical movement induced by the screws 27. It will be appreciated that frame 16 will be sized in accordance with the number of magazines serviced and thus screws 27 and guide rods 29 may be spaced laterally further apart when two magazines 12a and 12c are placed side by side. Accordingly, carriage assembly 30 will be fabricated in different transverse widths for the various embodiments. Platform 17 is supported on carriage assembly 30.

Platform 17 includes a base plate 31 and a slide plate 32 which is adjustable relative to base plate 31, both of which are mounted on a pair of slide bars 34. Base plate 31 and slide plate 32 support the elevated platform conveyor 61. Supported on base plate 31 is a manual width adjustment assembly which includes a support 62 and a track 60. Supported for lateral adjustment on track 60 is a belt conveyor assembly 61a which is alignable with one run of conveyor 11. Supported at the same height and parallel to belt conveyor 61a is belt conveyor assembly 61b which is aligned with the other run of conveyor 11. By adjusting the spacing between the conveyor assemblies 61a and 61b any width of board C presented by conveyor 11 may be accommodated on platform 17. It will be appreciated that the engagement of board C on the conveyor 61a, 61b is in a plane at a height above slide plate 32. Mounted to slide plate 31 subjacent the plane of conveyors 61a, 61b is a gripper travel assembly 35 including a linear actuator 63 mounted for extension and retraction parallel to conveyors 61a, 61b actuator 63 may be any suitable actuator. A vertically aligned linear actuator 70 is affixed to the gripper travel assembly 35 and movable therewith. Affixed to and movable vertically by actuator 70 is a gripper assembly 64 such as manufactured by Tolomatic having a set of jaws 65 which can engage the edge of a board C. It may be seen that the gripper assembly 64 may be positioned horizontally and vertically by the combination of the linear actuators.

A set of sensors and switches are provided to monitor the position of the gripper and the interaction thereof with boards C. Switch 71 is mounted in conjunction with gripper assembly 35 to indicate when the gripper is proximal the end of infeed conveyor 11. Switch 72 is mounted in conjunction with actuator 63 to indicate when actuator 63 has been extended sufficiently to release the board C to the magazine or to normally engage a board C positioned in the magazine. Switch 73 is mounted in conjunction with actuator 63 to indicate that actuator 63 has reached full extension. Switch 74 is mounted in conjunction with actuator 63 to indicate actuator 63 has reached a midstroke position. Switch 75 is mounted to the gripper assembly 64 to indicate that the gripper jaws 65 are open. A switch 76 is likewise mounted to indicate that the jaws 65 are closed. Switches 77 and 78 are mounted in conjunction with actuator 70 to indicate when the gripper assembly 65 is at the up and down position respectively. A through scan fiber optic sensor 91 is mounted to the conveyor assembly 61 to indicate the presence of a board C at the end proximal the infeed conveyor 11. A similar sensor 92 is mounted proximal the midpoint of the conveyor assembly to indicate the presence of a board at this position, and a third fiber optic sensor 93 is mounted at the end of the conveyor proximal the magazine to detect the presence of a board at that location. A fiber optic sensor or optical sensor 94 is carried on a channel shaped sensor mount 95 affixed to the gripper assembly 65. The sensor mount has an upper and lower leg 96 and 97 and a rear wall 98 such that a channel 99 is formed parallel to and opening in the same direction as the gap between the gripper jaws 65

Similarly various sensors are utilized to indicate cooperative positioning of the remaining components used in transferring the boards C. Upper and lower over-travel switches 101 and 102 indicate that the platform is at its vertical displacement limit. Magazine loaded switches 103 and 104 indicate that the magazines are properly positioned. Switch 106 indicates that the platform is at the home position adjacent and aligned with conveyor 11. Switch 107 indicates that the platform is near the home position. Through scan optical sensors 108 and 109 are to indicate proper alignment of the magazines 12 and the presence of boards C extending therefrom in to the vertical path of platform 16. All of the sensors provide input signals to a programmable logic device 111 which is programmed to execute stored programs and control the movement of the apparatus to load or unload boards.

Figure 6A:
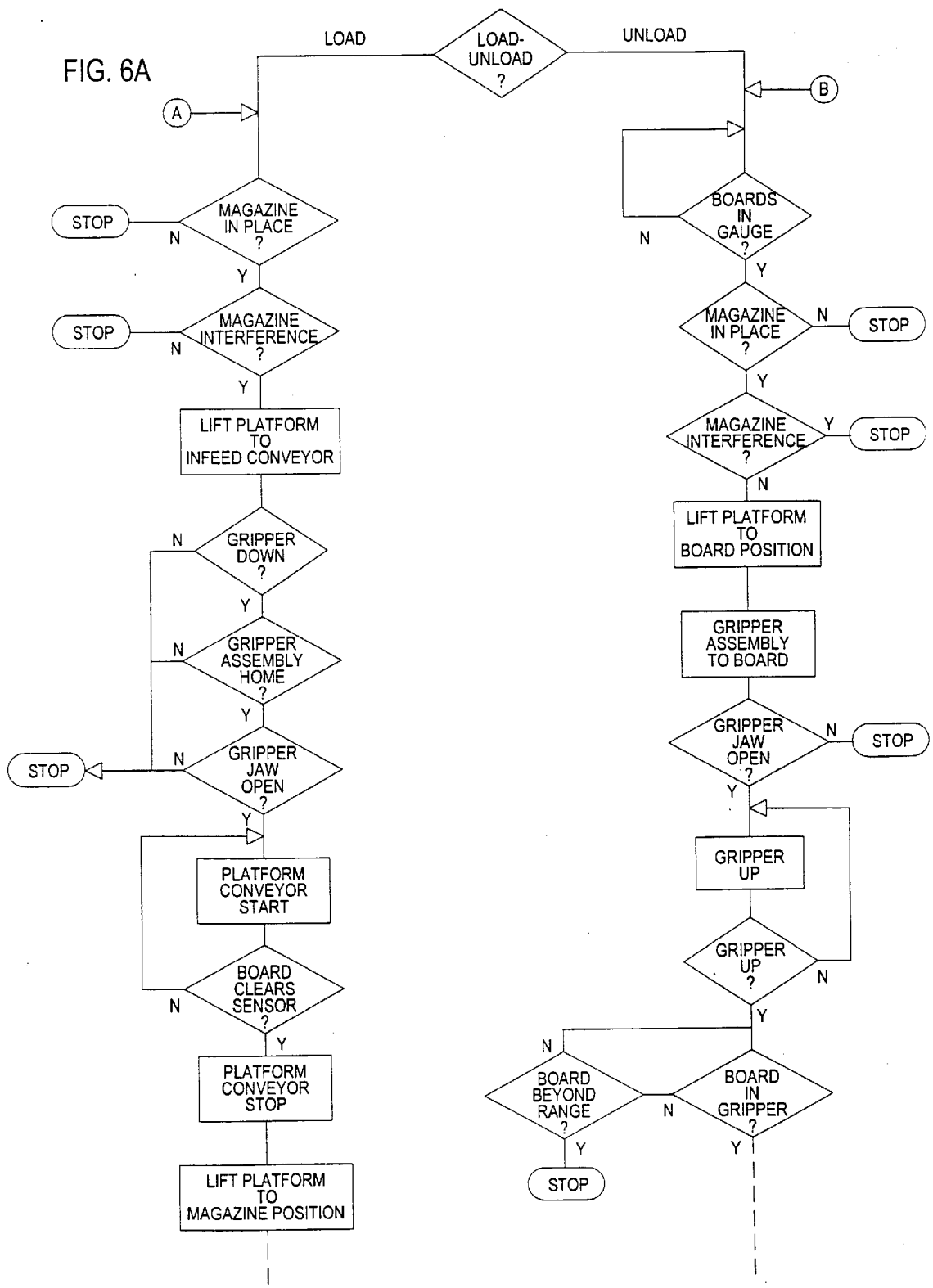
FIG. 6A and 6B is a flow chart of the operation of the apparatus.
Figure 6B:
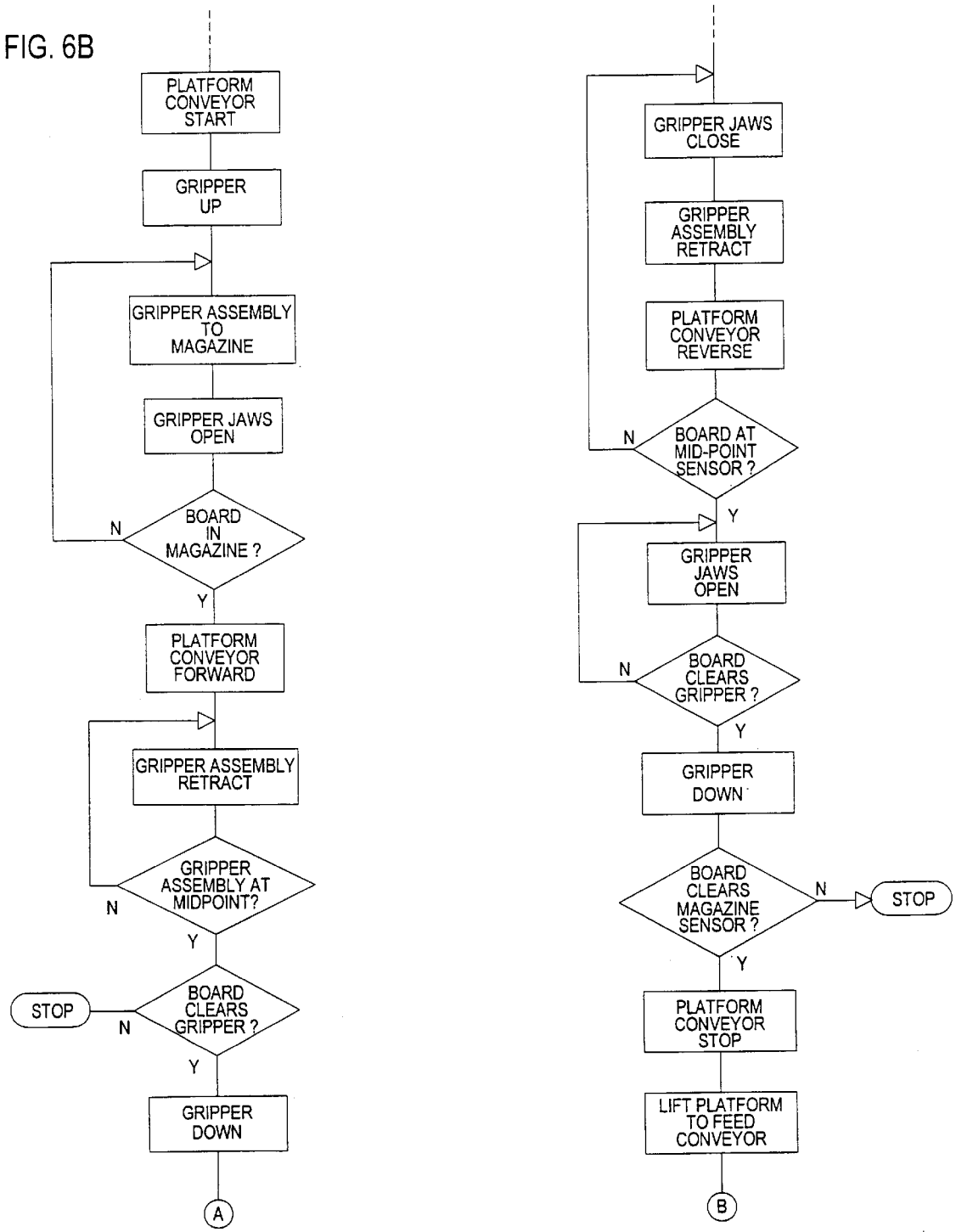

With the forgoing in mind the structure and operation of the apparatus may be more fully understood with reference to the drawings and the flow chart presented in FIG. 6A and 6B. As may be seen in the flow chart, loading of a magazine 12 commences with gripper travel assembly 35 at the home position with switches 71, 75, and 78 made indicating that actuator 63 is retracted and the gripper jaws are open. The operator installs a magazine in the selected receiver and thus makes switch 103 or 104. If the optical sensor 108 or 109 is covered by the magazine or anything in the magazine, the logic device 111 disables the lift and the platform will not move vertically. If the sensor is clear and the path of the platform is clear, the platform will move into alignment with the infeed conveyor 11 making switch 106. A sensor on the infeed conveyor indicates the presence of a board C to be delivered to the loader and signals for the platform conveyor 61 to commence running toward the magazine 12. A board C is thus passed from infeed conveyor 11 to platform conveyor 61 for movement toward the magazine. When optical sensor 91 indicates to logic device 111 that the trailing edge of board C has cleared the interface between conveyors 11 and 61, conveyor 61 is stopped and motor 20 is energized. As noted above motor 20 is a servo motor engaged with a pair of drive screws 27 through appropriate connections such that the motor and hence the rotation of the screws are precisely controllable. In this apparatus the motor and screw are calibrated such that the platform conveyor 61 is precisely displaceable from alignment with the infeed conveyor 11 to alignment with a selected slot in a magazine 12. Accordingly, when Board C is on conveyor 61, and motor 20 is energized, it drives the screws 27 to displace the conveyor 61 in alignment with the proper slot in magazine 12.

When the servo motor controller 21 indicates that the motor has stopped, conveyor 61 resumes running toward the magazine thereby partially urging board C into magazine 12. As the board C clears optical sensor 92 at the midpoint of conveyor 61, a pair of solenoids 121 and 122 are energized to control the valving of actuators 63 and 70 such that the actuators are extended such that the gripper assembly up switch 77 is made to indicate that the gripper assembly is raised to the proper height. In the load mode the gripper does not close on the edge of the board C, thus as the gripper jaws 65 receive the edge of the board C, the edge is simultaneously received within channel 99 of the sensor mount. As actuator 63 is extended, back wall 98 abuts the proximal edge of the board C and positively urges the board into magazine 12. Switch 72 is made when actuator 63 has extended sufficiently to properly place the board C in the magazine, whereupon switch 72 signals logic device 111 to stop platform conveyor 61 and initiate retraction of actuator 63. If optical sensor 94 indicates that the board has disengaged from channel 99 and gripper jaws 65 when midstroke switch 74 is made, then these signals to logic device 111 initiate retraction of actuator 70 to lower gripper assembly 64 until "down" switch 78 is made. If the magazine overhang optical sensor is not obscured, then the lift motor 20 returns the platform conveyor 61 to it home position aligned with the infeed conveyor. Switch 71 is made by the proper retraction of actuator 63 and the cycle is repeated for the next board until the magazine 12 is filled.

It should be appreciated that the cycle time is less than fifteen seconds and the logic device 111 is programmable to control the lift to align platform conveyor 61 with the slots in the magazine 12 to accommodate boards which have components of various heights thereon.

When the apparatus is used as an unloader the sequence is as follows. The operator delivers a magazine 12 to the frame and positions it such that switch 103 is made and moves a board gauge 141 supported by frame 16 into position adjacent the front of the magazine 12 to grossly align the boards C. The logic device 111 is programmed by the operator, or a prerecorded program is selected for the device such that the lift position and other parameters, such as the number and sequence of the magazines to be unloaded are known to the logic device. The lift begins with platform conveyor at the home position adjacent outfeed conveyor 11, with switches 71 and 78 made to indicate that the gripper assembly is at the home position and switch 75 made to indicate that gripper jaws 65 are open. If the magazine overhang optic sensor 108 is not obscured, then operation can proceed. The gauge is retracted to a storage position. Servo motor 20 advances platform conveyor 61 into alignment with a slot containing a board C, whereupon solenoids 121 and 122 are energized to extend actuator 63 and raise the gripper assembly 64 to the up position making switch 77.

As actuator 63 is extended, it moves the raised gripper assembly 64 with the gripper jaws 65 open, such that a board C in magazine 12 may be received within the jaws 65 and concomitantly within channel 99. When the board is received within channel 99, it obscures optical sensor 94 which initiates the energization of solenoid 123 to close jaws 65, thereby gripping board C along an edge margin thereof. Sensor 94 also signals for the reversal of the actuator 63 and for the beginning of platform conveyor 61 running toward the outfeed conveyor 11. It should be understood that if the actuator 63 extends to the full permitted range of travel, that is to say if it makes switch 73, without engaging a board which is detected by sensor 94, then the board for that magazine slot is positioned beyond the search range of the apparatus and an alarm is generated which may stop the apparatus or merely alert the operator. In the preferred embodiment the search range is set at two inches beyond the expected travel of the rod thus switch 73 is two inches beyond switch 72.

An engaged board C is pulled from the magazine by gripper assembly 64 due to the retraction of actuator 63 and is delivered onto platform conveyor 61. Gripper jaws 65 remain engaged on board C until midstroke switch 74 is made whereupon the jaws open and the board C is moved only by conveyor 61. When optical sensor 94 indicates that channel 99 and jaws 65 have retracted beyond the edge of board C, then actuator 70 retracts returning the gripper assembly to its lower position, making switch 78, and clearing the path for conveyor 61 to deliver the board to the end of the conveyor closest to outfeed conveyor 11. When optical sensor 91 is detects the presence of board C, conveyor 61 is stopped and magazine overhang sensor 108 is clear, then, the lift returns platform conveyor 61 to alignment with conveyor 11, making switch 106. When conveyor 61 and conveyor 11 are aligned conveyor 61 delivers board C to conveyor 11 and runs until the board is completely within the control of the outfeed conveyor. The sequence is repeated as needed to remove all the boards from the magazine.

Figure 7:
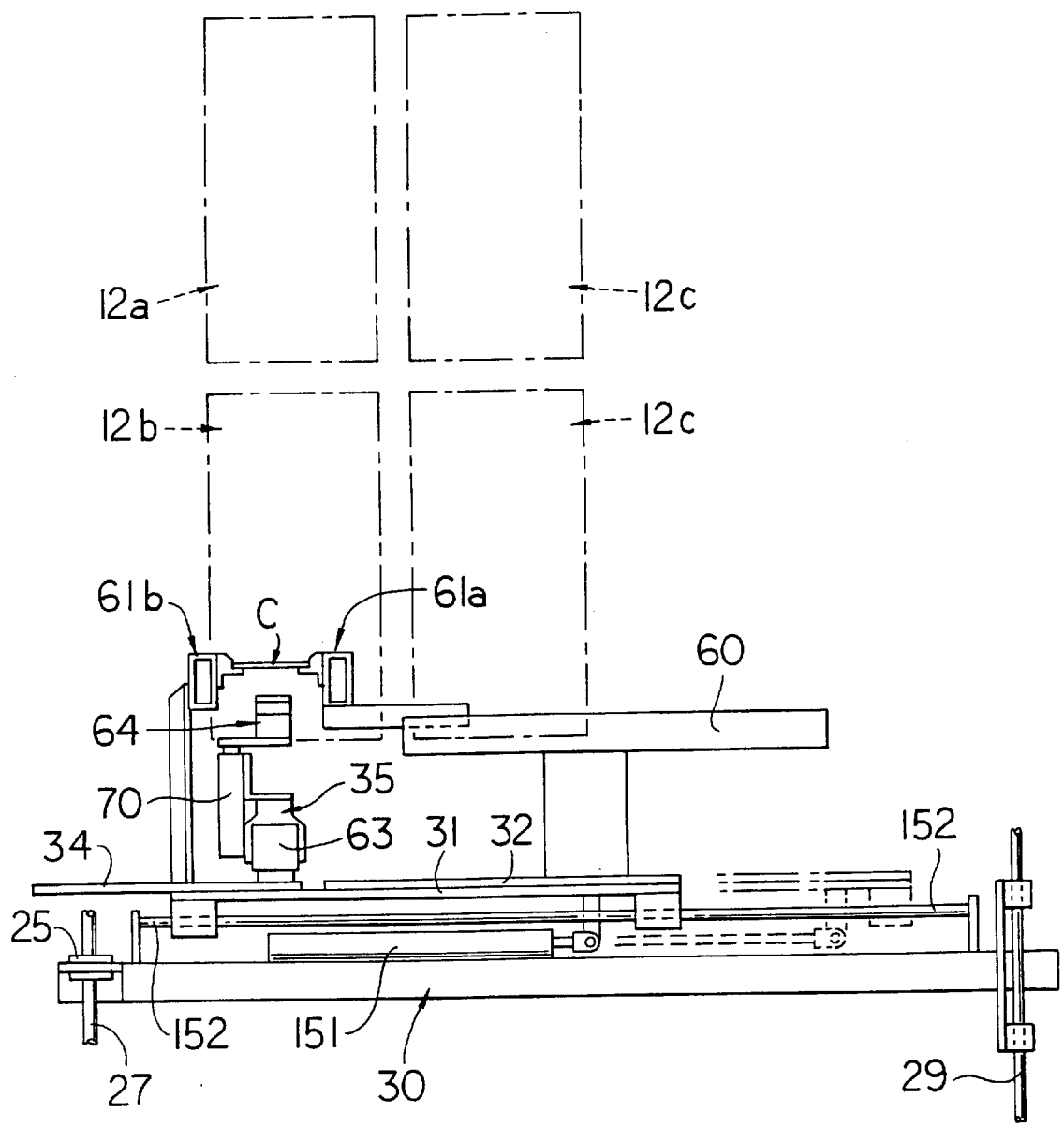
FIG. 7 is an elevational view of an embodiment employing four magazines.

As noted hereinabove, the magazine 12 may have separate magazines 12a to 12d in an array. Magazines in a vertical array may be serviced by the apparatus simply by programming the logic device 111 to control the vertical displacement of the platform conveyor 61 appropriately and by providing sensors at appropriate locations. As seen in FIG. 7, to enable side by side magazine service, platform 17 incorporates a transversely mounted linear actuator 151 affixed to carriage assembly 30 and to base plate 31, such that base plate 31 may be selectively urged along a set of rails 152 to a first position and an offset position, wherein the offset position aligns the platform conveyor with laterally offset magazines 12a and 12b. The lateral shift of the base plate and slide plate would be sequenced in the same manner as the vertical movement of the platform.

It will be further understood that slide plate is 32 displaceable relative to base plate 31 along slide bar 34 to enable the gripper jaws to be displaced relative to the width of platform conveyor 61 to engage the edge of a board at a selectable position to avoid interference with components mounted on the board. The slide plate is fixed in the selected position with slide nuts 40.

The forgoing description is intended by way of illustration and is not intended to limit the invention in any manner inconsistent with the scope of the claims presented herewith.

What I claim is:

1. Apparatus for loading and unloading circuit boards from a conveyor, comprising in combination:
   a. means for supporting a circuit board in a series of circuit boards, iteratively received from said conveyor at a fixed height, such that said circuit board has an exposed edge disposed toward said conveyor;
   b. means for incrementally adjusting the vertical position of said means for supporting relative to said fixed height;
   c. means, movable concomitantly vertically with said supporting means, for urging said supported circuit board horizontally to selectively remove circuit boards from and return circuit boards to said means for supporting by engaging said exposed edge of said circuit board, wherein said means for urging comprises gripping means for engaging said exposed edge at a selectively determined position of said circuit board and means for sensing the proximity of said gripping means to said exposed edge; and,
   d. means for controlling said adjusting means and said urging means.

2. Apparatus as defined in claim 1 further comprising means for moving said gripping means selectively between a first position aligned with said supporting means and a retracted position beneath said supporting means.

3. Apparatus for loading and unloading circuit boards from a conveyor, comprising in combination:
   a. means for supporting a circuit board in a series of circuit boards, iteratively received from said conveyor at a fixed height, such that said circuit board has an exposed edge disposed toward said conveyor;
   b. means for incrementally adjusting the vertical position of said means for supporting relative to said fixed height;
   c. means, movable concomitantly vertically with said supporting means, for urging said supported circuit board horizontally to selectively remove circuit boards from and return circuit boards to said means for supporting by engaging said exposed edge of said circuit board, said means for urging comprising gripping means for engaging said exposed edge of said circuit board and means for sensing the proximity of said gripping means to said exposed edge, said means for sensing comprising a photoelectric sensor and a mount for said sensor comprising a horizontally opening channel affixed to said gripping means and horizontally aligned therewith such that said exposed edge is received within said channel concomitantly with said gripping means, said channel having a first leg supporting said sensor and a second leg supporting a source of radiant energy to be detected by said sensor such that insertion of said exposed edge within said channel blocks transmission of said energy from said source to said sensor, and having a rear wall intermediate said first and second legs; and,
   d. means for controlling said adjusting means and said urging means.

4. Apparatus as defined in claim 3 wherein said means for urging comprises gripping means for engaging said exposed edge at a selectively determined position of said circuit board and means for sensing the proximity of said gripping means to said exposed edge.

5. Apparatus for loading and unloading circuit boards from a conveyor, comprising in combination:
   a. means for supporting a circuit board in a series of circuit boards, iteratively received from said conveyor at a fixed height, such that said circuit board has an exposed edge disposed toward said conveyor;
   b. means for incrementally adjusting the vertical position of said means for supporting relative to said fixed height;
   c. means, movable concomitantly vertically with said supporting means, for urging said supported circuit board horizontally to selectively remove circuit boards from and return circuit boards to said means for supporting by engaging said exposed edge of said circuit board, wherein said means for urging comprises gripping means for engaging said exposed edge at a selectively determined position of said circuit board and means for sensing the proximity of said gripping means to said exposed edge;
   d. means for controlling said adjusting means and said urging means; and
   e. means for retaining a plurality of circuit boards on individual supports in vertical spaced relationship positioned adjacent said supporting means with each of said individual supports positioned at fixed incremental vertical distances from said fixed height, said means for supporting including means for positioning a circuit board carried thereby into partial engagement with a selected individual support.

6. Apparatus for loading and unloading circuit boards from a conveyor, comprising in combination:
   a. means for supporting a circuit board in a series of circuit boards, iteratively received from said conveyor at a fixed height, such that said circuit board has an exposed edge disposed toward said conveyor;
   b. means for incrementally adjusting the vertical position of said means for supporting relative to said fixed height;
   c. means, movable concomitantly vertically with said supporting means, for urging said supported circuit board horizontally to selectively remove circuit boards from and return circuit boards to said means for supporting by engaging said exposed edge of said circuit board, said urging means comprising gripping means for engaging said exposed edge of said circuit board and means for sensing the proximity of said gripping means to said exposed edge;
   d. means for controlling said adjusting means and said urging means;

e. means for retaining a plurality of circuit boards on individual supports in vertical spaced relationship positioned adjacent said supporting means with each of said individual supports positioned at fixed incremental vertical distances from said fixed height, said means for supporting including means for positioning a circuit board carried thereby into partial engagement with a selected individual support; and, f. means for moving said gripping means selectively between a first position aligned with said supporting means and a retracted position beneath said supporting means.

7. Apparatus as defined in claim 6 wherein said means for sensing comprises:

a. a photoelectric sensor, and b. a mount for said sensor comprising a horizontally opening channel affixed to said gripping means and horizontally aligned therewith such that said exposed edge is received within said channel concomitantly with said gripping means, said channel having a first leg supporting said sensor and a second leg supporting a source of radiant energy to be detected by said sensor such that insertion of said exposed edge within said channel blocks transmission of said energy from said source to said sensor, and having a rear wall intermediate said first and second legs.

8. Apparatus as defined in claim 7 wherein said means for urging comprises gripping means for engaging said exposed edge at a selectively determined position of said circuit board and means for sensing the proximity of said gripping means to said exposed edge.

9. Apparatus for loading and unloading circuit boards from a conveyor, comprising in combination:

a. means for supporting a circuit board in a series of circuit boards, iteratively received from said conveyor at a fixed height, such that said circuit board has an exposed edge disposed toward said conveyor;

b. means for incrementally adjusting the vertical position of said means for supporting relative to said fixed height;

c. means, movable concomitantly vertically with said supporting means, for urging said supported circuit board horizontally to selectively remove circuit boards from and return circuit boards to said means for supporting by engaging said exposed edge of said circuit board, wherein said means for urging comprises gripping means for engaging said exposed edge at a selectively determined position of said circuit board and means for sensing the proximity of said gripping means to said exposed edge;

d. means for controlling said adjusting means and said urging means, wherein said controlling means comprises programmable means for determining the position of said supporting means from a plurality of inputs and providing control signals through a plurality of outputs, and sensor means operatively connected to said means for adjusting and said means for urging for sensing the position of said means for urging and outputting an informational signal to said programmable means; and e. means for retaining a plurality of circuit boards on individual supports in vertical spaced relationship positioned adjacent said supporting means with each of said individual supports positioned at fixed incremental vertical distances from said fixed height, said means for supporting including means for positioning a circuit board carried thereby into partial engagement with a selected individual support.

10. Apparatus as defined in claim 9 wherein said sensor means includes means for determining whether a board is properly positioned within said retaining means for retrieval by said gripping means, and outputting an informational signal to said programmable means.

11. Apparatus as defined in claim 10 wherein said determining means comprises:

a. means for detecting the position of said gripping means at selected positions proximal said retaining means; and b. a photoelectric sensor mounted in alignment with said gripping means to detect the engagement of said free edge within said gripping means, said detecting means and said sensor having outputs to said means for controlling.

* * * * *